United States Patent
Liu et al.

(10) Patent No.: US 10,249,527 B2
(45) Date of Patent: Apr. 2, 2019

(54) METHOD OF MANUFACTURING FLEXIBLE DISPLAY DEVICE

(71) Applicant: BOE TECHNOLOGY GROUP CO., LTD, Beijing (CN)

(72) Inventors: Lu Liu, Beijing (CN); Ming Che Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/107,098

(22) PCT Filed: Sep. 18, 2015

(86) PCT No.: PCT/CN2015/090015
§ 371 (c)(1),
(2) Date: Jun. 21, 2016

(87) PCT Pub. No.: WO2017/045202
PCT Pub. Date: Mar. 23, 2017

(65) Prior Publication Data
US 2017/0263488 A1  Sep. 14, 2017

(51) Int. Cl.
*H01L 21/683* (2006.01)
*H01L 27/32* (2006.01)
(Continued)

(52) U.S. Cl.
CPC ...... *H01L 21/6835* (2013.01); *H01L 27/1218* (2013.01); *H01L 27/1266* (2013.01);
(Continued)

(58) Field of Classification Search
None
See application file for complete search history.

(56) References Cited

U.S. PATENT DOCUMENTS 6,960,272 B1 * 11/2005 Tokas .................... B60C 1/00
156/128.6
2003/0054643 A1 * 3/2003 Aihara ............... H01L 21/6836
438/689
(Continued)

FOREIGN PATENT DOCUMENTS

CN    101351063 A    1/2009
CN    101877319 A    11/2010
(Continued)

OTHER PUBLICATIONS

The World Intellectual Property Organization (WIPO) International Search Report for PCT/CN2015/090015 dated Apr. 27, 2016.
(Continued)

*Primary Examiner* — Charles D Garber
*Assistant Examiner* — Xiaoming Liu
(74) *Attorney, Agent, or Firm* — Avova Law Group, PLLC

(57) ABSTRACT

Methods for manufacturing a flexible display device are provided. A flexible substrate is provided and a first bonding pattern, which encloses a display area, is formed on the flexible substrate. A second bonding pattern is formed on a rigid substrate. The first and second bonding patterns are bonded together to provide a bonding pattern between the flexible substrate and the rigid substrate. At least one display device is formed on the display area of the flexible substrate. The bonding pattern is removed by a cutting process performed so as to separate the flexible substrate having the display device thereon from the rigid substrate.

16 Claims, 4 Drawing Sheets

(51) Int. Cl.
*H01L 27/12* (2006.01)
*H01L 51/00* (2006.01)

(52) U.S. Cl.
CPC ........ *H01L 51/003* (2013.01); *H01L 51/0097* (2013.01); *H01L 27/3244* (2013.01); *H01L 2221/6835* (2013.01); *H01L 2221/68381* (2013.01); *H01L 2227/326* (2013.01); *H01L 2251/5338* (2013.01); *Y02E 10/549* (2013.01)

(56) References Cited

U.S. PATENT DOCUMENTS

| | | |
|---|---|---|
| 2004/0231141 A1 | 11/2004 | Nishinaka et al. |
| 2005/0034979 A1* | 2/2005 | Druz ................... C23C 14/044 204/298.02 |
| 2009/0020592 A1 | 1/2009 | Lee et al. |
| 2011/0204361 A1 | 8/2011 | Nishiki et al. |
| 2011/0223357 A1 | 9/2011 | Umemori |
| 2012/0235315 A1* | 9/2012 | Wu ..................... H01L 21/6835 264/104 |
| 2014/0072724 A1* | 3/2014 | Hwu ........................ B32B 7/06 427/553 |

FOREIGN PATENT DOCUMENTS

| | | |
|---|---|---|
| CN | 102176435 A | 9/2011 |
| CN | 102218832 A | 10/2011 |
| CN | 103236418 A | 8/2013 |
| CN | 103943544 A | 7/2014 |
| JP | 4727024 B2 | 7/2011 |

OTHER PUBLICATIONS

State Intellectual Property Office of the P.R.C (SIPO) Office Action 1 for 201580000909.X dated Feb. 12, 2018 14 Pages.

* cited by examiner

METHOD OF MANUFACTURING FLEXIBLE DISPLAY DEVICE

CROSS-REFERENCES TO RELATED APPLICATIONS

This application is a national phase entry under 35 U.S.C. § 371 of International Application No. PCT/CN2015/090015, filed on Sep. 18, 2015, the entire content of which is incorporated herein by reference.

FIELD OF THE DISCLOSURE

The present disclosure generally relates to the field of the display technologies and, more particularly, relates to methods of manufacturing a flexible display device.

BACKGROUND

Currently, a roll-to-roll process or sheet-by-sheet process is used for manufacturing flexible electronic devices. The sheet-by-sheet process is able to utilize existing manufacturing equipment and processes for manufacturing display panels. In the sheet-by-sheet process, a rigid substrate is used as a carrier and a flexible substrate is formed on the rigid substrate. After forming the display device, the flexible substrate is separated from the rigid substrate. Conventional flexible substrate may include a polyimide (PI) film formed by coating and drying a PI solution on a glass substrate. Display devices may be formed on this coated PI film as the flexible substrate to provide a flexible display device. The coated PI film often has strong bonding with the glass substrate and thus is hard to be separated from the glass substrate.

Laser release technologies, such as laser lifting off (LLO) processes, may be used to de-bond the flexible substrate from the rigid substrate. When utilizing laser to illuminate the PI film, the PI film may be ablated and then separated from the glass substrate. During this course, laser controlling is significantly critical. When too-low laser energy is used, the PI film and the glass substrate cannot be completely separated from each other and the separation process may destroy the display device. When too-high laser energy is used, the PI film over the rigid substrate may be ablated and ashed. Transmittance of the PI film is decreased. This may create more undesirable issues particularly when transparent materials with high transmittance are used.

The disclosed methods for manufacturing the flexible display device may at least partially alleviate one or more problems set forth above and other problems.

BRIEF SUMMARY OF THE DISCLOSURE

One aspect of the present disclosure includes a method for manufacturing a flexible display device. A flexible substrate is provided and a first bonding pattern, which encloses a display area, is formed on the flexible substrate. A second bonding pattern is formed on a rigid substrate. The first and second bonding patterns are bonded together to provide a bonding pattern between the flexible substrate and the rigid substrate. At least one display device is formed on the display area of the flexible substrate. The bonding pattern is removed by a cutting process performed so as to separate the flexible substrate having the display device thereon from the rigid substrate.

Optionally, the step of bonding the first and second bonding patterns together includes pressing the first substrate against the rigid substrate under vacuum.

Optionally, the first and second bonding patterns together are bonded at room temperature.

Optionally, the cutting process is performed under an atmospheric condition and at a room temperature.

Optionally, prior to forming the first bonding pattern on the flexible substrate, at least a surface portion of the flexible substrate is treated by an ion beam. The treated surface portion is prepared for forming the first bonding pattern.

Optionally, prior to forming the second bonding pattern on the rigid substrate, at least a surface portion of the rigid substrate is treated by an ion beam. The treated surface portion is prepared for forming the second bonding pattern.

Optionally, the bonding pattern corresponds to a peripheral region of the display area for the at least one display device.

Optionally, each of the first and second bonding patterns is defined by an inner shape and an outer shape. Optionally, each of the inner shape and the outer shape has a closed periphery. Optionally, each of the inner shape and the outer shape includes a circle, a rectangle, or a triangle.

Optionally, the first bonding pattern, the second bonding pattern, and the bonding pattern are doughnut-shaped. Optionally, the inner shape and the outer shape are same. Optionally, the inner shape and the outer shape are different.

Optionally, the first bonding pattern or the second bonding pattern is made of a material including a metal, a metal alloy, a metal oxide, or a combination thereof. Optionally, the first bonding pattern or the second bonding pattern contains a metal element including silicon, copper, gold, iron, or a combination thereof.

Optionally, the flexible substrate is made of a plastic, polyimide (PI), polyester, Mylar, or stainless steel foil. Optionally, the rigid substrate is made of silicon, quartz, rigid plastic, or glass.

Optionally, the display device includes a thin-film transistors or a light-emitting diode.

Other aspects of the present disclosure can be understood by those skilled in the art in light of the description, the claims, and the drawings of the present disclosure.

DETAILED DESCRIPTION

For those skilled in the art to better understand the technical solution of the disclosure, reference will now be made in detail to exemplary embodiments of the disclosure, which are illustrated in the accompanying drawings. Wherever possible, the same reference numbers will be used throughout the drawings to refer to the same or like parts.

Figure 1:
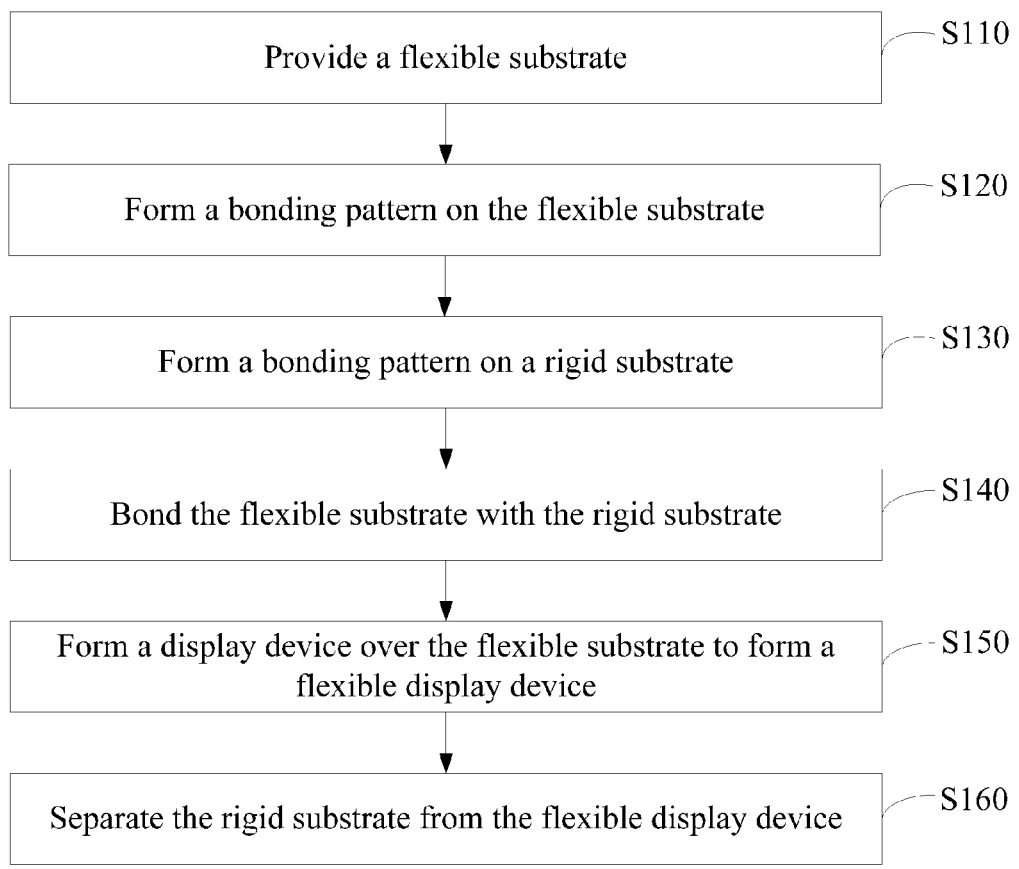
FIG. 1 illustrates an exemplary method of manufacturing a flexible display device according to various disclosed embodiments.

According to the disclosed embodiments, methods for manufacturing a flexible display device are provided. FIG. 1 illustrates an exemplary method of manufacturing a flexible display device according to the disclosed embodiments.

As shown in FIG. 1, at the beginning of the method, in step S110, a flexible substrate is provided. A first bonding pattern is then formed on surface of the flexible substrate in Step S120.

Figure 2A:
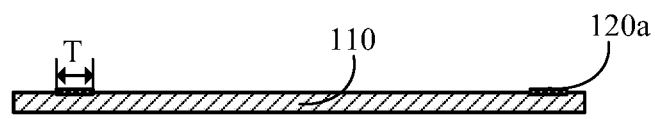
FIGS. 2a-2b, 3a-3b, and 4-6 illustrate exemplary structures corresponding to certain stages during the manufacturing method according to various disclosed embodiments.
Figure 2B:
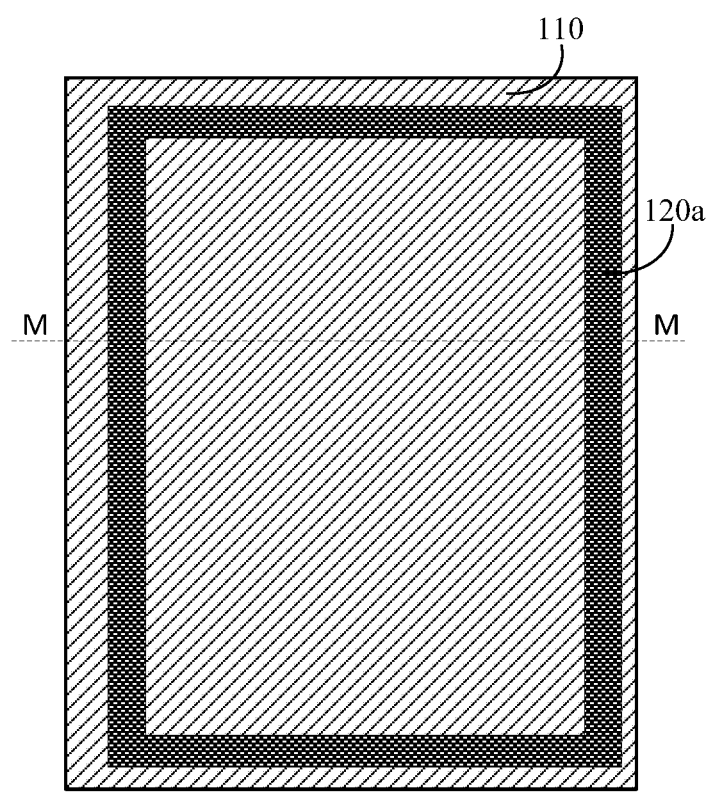

FIGS. 2a-2b illustrate a corresponding structure. Specifically, FIG. 2a illustrates a cross sectional view along M-M direction of a top view of the structure shown in FIG. 2b. As shown in FIGS. 2a-2b, a flexible substrate 110 is provided, and a first bonding pattern 120a is formed on the flexible substrate 110.

The flexible substrate 110 may be made of a flexible material, such as, for example, plastic, polyimide (PI), polyester, Mylar, and/or stainless steel foil. In some embodiments, the flexible substrate 110 may be optically transparent or have a desired optical transmittance. In one embodiment, the flexible substrate 110 includes a PI layer. Unlike conventionally coated PI substrate, the PI layer used herein may be individually prepared or may be commercially provided by suitable suppliers.

The first bonding pattern 120a may be formed having a shape, size and position respectively based on the shape, size, and position of the flexible substrate 110 and/or based on the shape, size, and position of the display device to be subsequently formed on the flexible substrate 110. For example, the first bonding pattern 120a on the flexible substrate 110 may include a closed structure, e.g., having a regular or irregular annular shape.

In one embodiment, the first bonding pattern 120a may be defined by an inner shape and an outer shape. The inner shape and/or the outer shape may include any regular or irregular shape. The inner shape and the outer shape of the first bonding pattern 120a may have a closed periphery. For example, the inner shape and/or the outer shape may be a circle, a rectangle (e.g., a square), a triangle, or any closed shape. The inner shape and the outer shape of the first bonding pattern 120a may be the same or different.

The first bonding pattern 120a may have a thickness between the inner shape and the outer shape to allow subsequent bonding between the flexible substrate 110 and a rigid substrate. In one embodiment, when the inner shape and the outer shape have the same shape and are concentric, the thickness there-between may be uniformly configured. In another embodiment, when the inner shape and the outer shape have different shapes and/or are un-concentric, the thickness there-between may not be uniformly configured. In a certain embodiment, the first bonding pattern 120a is doughnut-shaped.

To form the first bonding pattern 120a, a surface treatment may be performed on the flexible substrate 110. The surface treatment may include, for example, an ion beam treatment to treat organic contaminations on surface of the flexible substrate. The ion beam may include, e.g., Ar ion beam. The surface treatment may be performed selectively or sometimes locally on desired surface portion of the flexible substrate 110. Such selectively-treated surface portion may at least cover the surface portion for subsequently forming the first bonding pattern 120a thereon. Of course, in some embodiments, an entire surface of the flexible substrate 110 may be treated, e.g., by an ion beam, while the first bonding pattern 120a may be formed on desired surface portion of the flexible substrate.

After the surface treatment, one or more bonding materials may be formed on the surface portion of the flexible substrate 110, e.g., by sputtering, to form the first bonding pattern 120a. The bonding material may include metal, metal alloy, and/or metal oxide, each including a metal of silicon, copper, gold, and/or iron. The first bonding pattern 120a may be a single layer or a multilayer. In various embodiments, the surface treatment may be optional, and the bonding materials may be formed directly on the flexible substrate.

In other embodiments, the first bonding pattern 120a may be formed by first forming a bonding layer on the entire surface of the flexible substrate, with or without surface treatment, and then patterning the bonding layer to form the first bonding pattern, for example, using a photolithographic process.

Figure 3A:
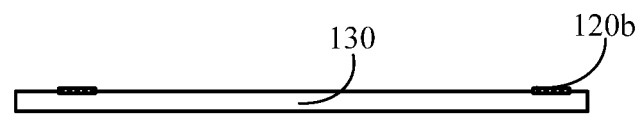
Figure 3B:
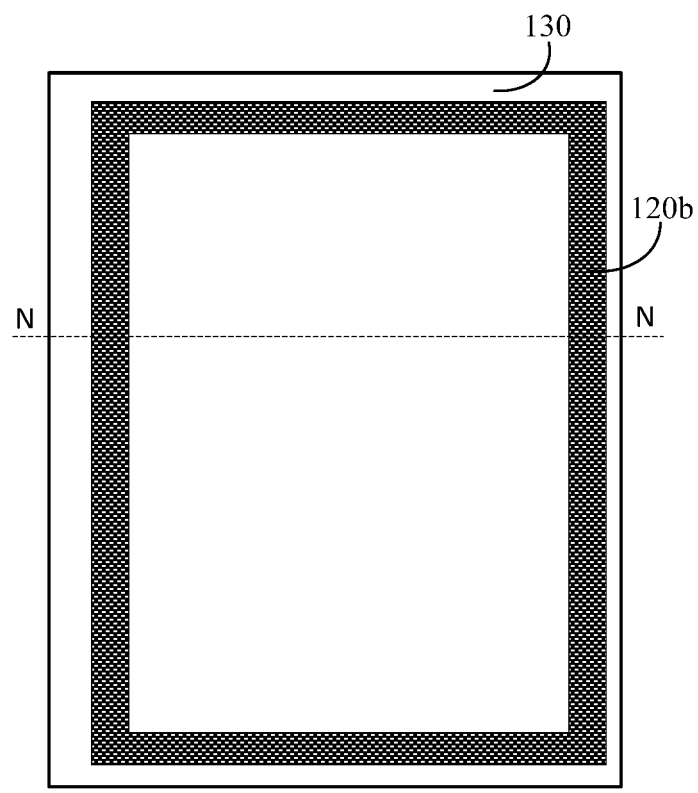

Referring back to FIG. 1, in Step S130, a second bonding pattern is formed on surface of a rigid substrate. FIGS. 3a-3b illustrate a corresponding structure. Specifically, FIG. 3a illustrates a cross sectional view along N-N direction of a top view of the structure shown in FIG. 3b.

As shown in FIGS. 3a-3b, a rigid substrate 130 is provided, and a second bonding pattern 120b is formed on the rigid substrate 130.

The rigid substrate 130 may be any rigid substrate formed of any appropriate material including, for example, silicon, quartz, rigid plastic, glass, etc. The rigid substrate 130 may or may not be optically transparent. In one embodiment, the rigid substrate 130 is made of glass. The rigid substrate 130 may provide a base for subsequent devices and processes.

In one embodiment, the rigid substrate 130 is used as a carrier substrate for forming a flexible device, including the flexible substrate 110 along with a display device. After forming the flexible device, the rigid substrate 130 may be separated there-from.

The second bonding pattern 120b formed on the rigid substrate 130 may be the same or different from the first bonding pattern 120a formed on the flexible substrate 110, for example, using same or different materials and/or processes. Meanwhile, the rigid substrate 130 may be treated the same or differently from the flexible substrate 110 as described in Step S120.

The second bonding pattern 120b may be formed having a shape, size and position respectively based on the shape, size, and position of the rigid substrate 130, the flexible substrate 110, and/or the display device to be subsequently formed on the flexible substrate 110. For example, the second bonding pattern 120b on the rigid substrate 130 may include a closed structure, e.g., having a regular or irregular annular shape.

In one embodiment, the second bonding pattern 120b may be defined by an inner shape and an outer shape. The inner shape and/or the outer shape may include any regular or irregular shape. The inner shape and the outer shape of the second bonding pattern 120b may have a closed periphery. For example, the inner shape and/or the outer shape may be a circle, a rectangle (e.g., a square), a triangle, or any closed shape. The inner shape and the outer shape of the second bonding pattern 120b may be the same or different.

The second bonding pattern 120b may have a thickness T between the inner shape and the outer shape to allow subsequent bonding between the flexible substrate 110 and the rigid substrate 130. In one embodiment, when the inner shape and the outer shape have the same shape and are concentric, the thickness there-between may be uniformly configured. In another embodiment, when the inner shape and the outer shape have different shapes and/or are un-concentric, the thickness there-between may not be uniformly configured. In a certain embodiment, the second bonding pattern 120b is doughnut-shaped.

To form the second bonding pattern 120b, a surface treatment may be performed on the rigid substrate 130. The surface treatment may include, for example, an ion beam treatment to treat/remove organic contaminations on surface of the rigid substrate 130. The ion beam may include, e.g., Ar ion beam. The surface treatment may be performed selectively or sometimes locally on desired surface portion of the rigid substrate 130. Such selectively-treated surface portion may at least cover the surface portion for subsequently forming the second bonding pattern 120b thereon. Of course, in some embodiments, an entire surface of the rigid substrate 130 may be treated, e.g., by an ion beam, while the second bonding pattern 120b may be formed on desired surface portion of the rigid substrate 130.

After the surface treatment, one or more bonding materials may be formed on the surface portion of the flexible substrate 110, e.g., by sputtering, to form the second bonding pattern 120b. The bonding material may include metal, metal alloy, and/or metal oxide, each including a metal of silicon, copper, gold, and/or iron. The second bonding pattern 120b may be a single layer or a multiplayer. In various embodiments, the surface treatment may be optional, and the bonding materials may be formed directly on the rigid substrate 130.

In other embodiments, the second bonding pattern 120b may be formed by first forming a bonding layer on the entire surface of the flexible substrate, with or without surface treatment, and then patterning the bonding layer to form the second boding pattern, for example, using a photolithographic process.

Figure 4:
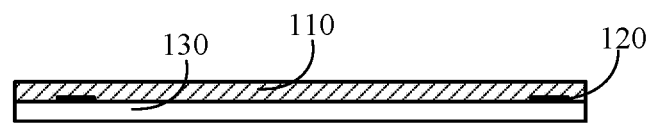

Referring back to FIG. 1, in Step S140, the flexible substrate 110 and the rigid substrate 130 may be bonded together by aligning and bonding the first bonding pattern 120a and the second bonding pattern 120b together, as shown in FIG. 4. In one embodiment, a high pressure may be used to bond the first and second bonding patterns 120a-b under vacuum to laminate the flexible substrate 110 with the rigid substrate 130.

For example, at room temperature, the first bonding pattern 120a of the flexible substrate 110 and the second bonding pattern 120b of the rigid substrate 130 may be placed in contact with one another, and then vacuum laminated by pressing with high pressure. In one embodiment, the flexible substrate 110 having the first bonding pattern 120a may be applied to the rigid substrate 130 by a roller or by a hard mold. As shown in FIG. 4, the first bonding pattern 120a and the second bonding pattern 120b are bonded together to form a bonding pattern 120 between the flexible substrate 110 and the rigid substrate 130.

In addition, the bonding pattern 120 may be formed under vacuum between the flexible substrate 110 and the rigid substrate 130. For example, a high pressure applied on the first and second bonding patterns 120 a/b under vacuum may provide covalent bond there-between to form the bonding pattern 120. The covalent bond may include metallic bonding between the first and second bonding patterns 120 a/b to form the bonding pattern 120.

Figure 5:
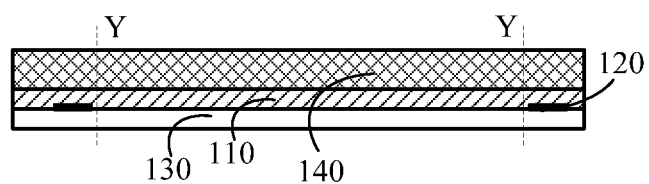

Referring back to FIG. 1, in Step 150, a display device may be formed on the flexible substrate that is bonded on the rigid substrate. FIG. 5 illustrates a corresponding structure.

As shown in FIG. 5, one or more display devices 140 may be formed on the flexible substrate 110 that is bonded with the rigid substrate 130. The display device 140 may include, for example, a thin-film transistor, a light-emitting diode such as an organic light-emitting diode (OLED) or an active matrix OLED, and/or any other suitable devices. For example, the display device 140 may be formed on a surface portion of the flexible substrate 110 within a display area defined, e.g., enclosed, by the bonding pattern 120a. More specifically, the display device 140 may be formed on the surface portion of the flexible substrate 110 opposing the inner shape enclosed by the first bonding pattern 120a.

In various embodiments, a peripheral circuit (not shown) may be formed over the display device 140. In various embodiments, the flexible substrate 110, the display device 140 and/or the peripheral circuit may form a flexible display device. The peripheral circuit may be pressed on the display device 140. The peripheral circuit may include the circuits to drive the display device, and/or any other suitable interconnect structures.

Referring back to FIG. 1, in Step 160, the bonding pattern 120 is removed from the bonded structure by a cutting process.

Figure 6:
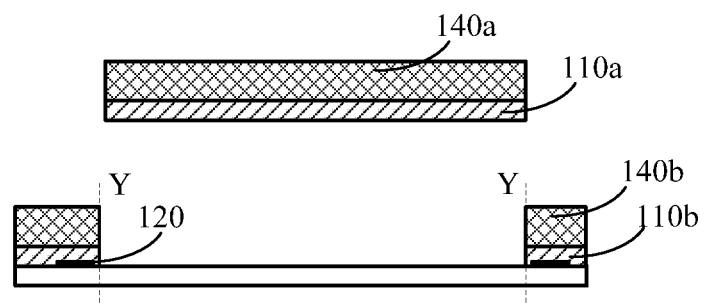

As shown in FIG. 6, the cutting process can be performed within or at the edge of the display area defined by the bonding pattern 120 and through the flexible substrate 110, e.g., along Y-direction with respect to the bonding pattern 120 to at least include the flexible device. The cutting process is performed, such that the bonding pattern 120 is cut away from the display device 140. The cutting process is performed under atmospheric conditions and/or at room temperature. Once the cutting process is performed, the previous vacuum condition between the rigid substrate 130 and the flexible substrate 110, along with the display device 140, is removed, e.g., open to the atmosphere. This provides, e.g., a free-standing flexible display device, including the flexible substrate 110a and the display device 140a on the flexible substrate 110a.

During the cutting process, the rigid substrate 130 may or may not be cut. Once the cutting process is complete, the free-standing flexible display device, including the flexible substrate 110a and the display device 140a, may be transferred, manually or by a machine via vacuum absorption on surface of the flexible display device, and may be ready for use.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for manufacturing a flexible display device, comprising:
    providing a flexible substrate;
    forming a first bonding layer on an entire surface of the flexible substrate;
    patterning the first bonding layer to form a first bonding pattern by a photolithographic process, the first bonding pattern enclosing a display area without touching a boundary of the flexible substrate and being a multilayer;
    forming a second bonding layer on an entire surface of a rigid substrate;
    patterning the second bonding layer to form a second bonding pattern by a photolithographic process, the second bonding pattern corresponding to the first bonding pattern and being a multilayer;
    bonding the first and second bonding patterns together to provide a bonding pattern between the flexible substrate and the rigid substrate such that at least a portion of the flexible substrate is in contact with the rigid substrate in the display area;
    forming at least one display device on the display area of the flexible substrate; and removing the bonding pattern by a cutting process performed so as to separate the flexible substrate having the display device thereon from the rigid substrate.

2. The method according to claim 1, wherein the step of bonding the first and second bonding patterns together includes:
pressing the first substrate against the rigid substrate under vacuum.

3. The method according to claim 2, wherein:
the step of bonding the first and second bonding patterns together is performed at room temperature.

4. The method according to claim 1, wherein:
the cutting process is performed under an atmospheric condition and at a room temperature.

5. The method according to claim 1, further including:
treating at least a surface portion of the flexible substrate by an ion beam prior to forming the first bonding layer on the flexible substrate, wherein the treated surface portion is prepared for forming the first bonding layer.

6. The method according to claim 1, further including:
treating at least a surface portion of the rigid substrate by an ion beam prior to forming the second bonding layer on the rigid substrate, wherein the treated surface portion is prepared for forming the second bonding layer.

7. The method according to claim 1, wherein:
the bonding pattern corresponds to a peripheral region of the display area for the at least one display device.

8. The method according to claim 1, wherein:
each of the first and second bonding patterns is defined by an inner shape and an outer shape.

9. The method according to claim 8, wherein:
each of the inner shape and the outer shape has a closed periphery.

10. The method according to claim 8, wherein:
each of the inner shape and the outer shape includes a circle, a rectangle, or a triangle.

11. The method according to claim 8, wherein:
the first bonding pattern, the second bonding pattern, and the bonding pattern are doughnut-shaped.

12. The method according to claim 1, wherein:
the first bonding pattern or the second bonding pattern is made of a material including a metal, a metal alloy, a metal oxide, or a combination thereof.

13. The method according to claim 12, wherein:
the first bonding pattern or the second bonding pattern contains a metal element including silicon, copper, gold, iron, or a combination thereof.

14. The method according to claim 1, wherein:
the flexible substrate is made of a plastic, polyimide (PI), polyester, Mylar, or stainless steel foil.

15. The method according to claim 1, wherein:
the rigid substrate is made of silicon, quartz, rigid plastic, or glass.

16. The method according to claim 1, wherein:
the display device includes a thin-film transistor or a light-emitting diode.

* * * * *